United States Patent [19]
Nagano et al.

[11] Patent Number: 5,408,199
[45] Date of Patent: Apr. 18, 1995

[54] GAIN CONTROL AMPLIFIER HAVING REDUCED FEEDBACK RESISTANCE

[75] Inventors: Yoshiaki Nagano; Fumihide Murao, both of Itami, Japan

[73] Assignee: Mitsubishi Denki Kabushiki Kaisha, Tokyo, Japan

[21] Appl. No.: 223,030

[22] Filed: Apr. 5, 1994

[30] Foreign Application Priority Data

Apr. 15, 1993 [JP] Japan .................. 5-088542

[51] Int. Cl.⁶ .............................. H03G 3/20
[52] U.S. Cl. ........................ 330/284; 330/129
[58] Field of Search .......... 330/51, 69, 129, 278, 330/284

[56] References Cited

U.S. PATENT DOCUMENTS

5,140,283  8/1992  Reed ................... 330/284

Primary Examiner—Steven Mottola
Attorney, Agent, or Firm—Oblon, Spivak, McClelland, Maier & Neustadt

[57] ABSTRACT

There is disclosed a gain control amplifier wherein a signal input terminal (1) receiving an input signal ($V_{in}$) is connected to a variable resistor portion (71) including an R-2R ladder resistor group and switches ($K_1$ to $K_4$), and an operational amplifier (10) and resistors ($r_1$, $r_2$, $r_3$) construct an adding circuit (91), which outputs an output signal ($V_{out}$) to a signal output terminal (5). Each of the switches ($K_1$ to $K_4$) includes terminals (A, B) and a common terminal (C) connected to one of the terminals (A, B). All of the terminals (A) are connected to the signal input terminal (1) in common, and all of the terminals (B) are grounded in common. The ladder resistor group (R,2R) need not be of great resistance value. Thus, a gain control amplifier is achieved which is permitted to control a gain widely, finely and linearly without resistors of great resistance.

13 Claims, 13 Drawing Sheets

GAIN CONTROL AMPLIFIER HAVING REDUCED FEEDBACK RESISTANCE

BACKGROUND OF THE INVENTION

1. Field of the Invention

The present invention relates to a gain control amplifier.

2. Description of the Background Art

FIG. 13 is a circuit diagram of a conventional gain control amplifier. An input signal $V_{in}$ applied to a signal input terminal 1 is transmitted to an inverting input of an amplifier 3 through an input resistor 2. A reference power supply 6 is connected to a non-inverting input of the amplifier 3, and a feedback resistor portion 4 is connected between the inverting input and the output of the amplifier 3. An output signal $V_{out}$ is given to a signal output terminal 5. The relation between the input signal $V_{in}$ and the output signal $V_{out}$ is as follows:

$$V_{out} = - \frac{Z}{r_0} V_{in} \qquad (1)$$

where Z is a resistance of the feedback resistor portion 4.

When switches $K_5$ to $K_8$ are off, the resistance Z is equal to a resistance R and Equation (1) is expressed as:

$$V_{out} = - \frac{R}{r_0} V_{in} \qquad (2)$$

When the switches $K_s$ to $K_s$ are on, the resistance Z is equal to a value provided by parallel connection of five resisters of resistances R, 2R, 4R, 8R, 16R, respectively, and Equation (1) is expressed as:

$$V_{out} = - \frac{1}{r_0} \cdot \frac{8}{15} R \cdot V_{in} \qquad (3)$$

Assuming that $r_0 = R$, a controllable gain G range is given from Equations (2) and (3) as:

$$G = \frac{V_{out}}{V_{in}} = -1 \text{ to } -\frac{8}{15} \qquad (4)$$

It is thus seen that the gain is linearly controllable in the range of 1 to about ½ times.

In the above conventional gain control amplifier, the feedback resistor portion 4 requires a resistance sixteen ($2^4$) times greater than the input resistance R where $r_0 = R$. In FIG. 13, the gain is shown as controlled in 15 ($=2^4-1$) steps. For finer control, for example ($2^n-1$) step control, the feedback resistor portion 4 requires a resistance $2^n$ times greater than the input resistance R.

The conventional gain control amplifier is disadvantageous in that finer, linear control of the gain necessitates a resistor of an extremely great resistance.

SUMMARY OF THE INVENTION

According to the present invention, a gain control amplifier comprises: (a) a signal input terminal and a signal output terminal; (b) a potential point for supplying a reference potential; (c) a variable resistor portion having a first input connected to the signal input terminal, a second input connected to the potential point, and an output; and (d) an arithmetic portion having a first input connected to the signal input terminal, a second input connected to the output of the variable resistor portion, a third input connected to the potential point, and an output connected to the signal output terminal, for performing a linear calculation on values applied to the first to third inputs thereof to output a calculated value to the output thereof, the variable resistor portion including: (c-1) first to N-th ($2 \leq N$) switches each including first and second ends connected respectively to the first and second inputs of the variable resistor portion and a common end connected to one of the first and second ends thereof; (c-2) resistors $R_K (1 \leq K \leq N)$ each having a first end connected to the common end of the K-th switch and a second end; (c-3) a resistor $R_{M,(M+1)}$ ($1 \leq M \leq (K-1)$) for connecting the second end of the M-th resistor $R_M$ to the second end of the (M+1)-th resistor $R_{(M+1)}$; and (c-4) a resistor $R_0$ having a first end connected to the second end of the resistor $R_1$ and a second end, (c-5) the resistor $R_{M,(M+1)}$ being of a resistance R and the resistors $R_0$ to $R_N$ being of a resistance 2R, (c-6) the second end of the resistor $R_0$ being connected to one of the first and second inputs of the variable resistor portion, (c-7) the second end of the resistor $R_N$ being connected to the output of the variable resistor portion.

Preferably, the arithmetic portion is an adding circuit for performing addition.

Preferably, the arithmetic portion is a subtraction circuit for performing subtraction.

Preferably, the second end of the resistor $R_0$ is connected to the first input of the variable resistor portion.

Preferably, the second end of the resistor $R_0$ is connected to the second input of the variable resistor portion.

Preferably, the reference potential is a ground potential.

The variable resistor portion of the present invention includes an R-2R ladder resistor group, and the potential appearing at the output thereof is controlled linearly by the switching of the switches.

A resistor having a great resistance is not required to widen or narrow the gain control range, permitting linear control of the gain.

An object of the present invention is to provide a gain control amplifier adapted for fine, linear gain control without the use of a large resistor.

These and other objects, features, aspects and advantages of the present invention will become more apparent from the following detailed description of the present invention when taken in conjunction with the accompanying drawings.

DESCRIPTION OF THE PREFERRED EMBODIMENTS

A. First Preferred Embodiment

Figure 1:
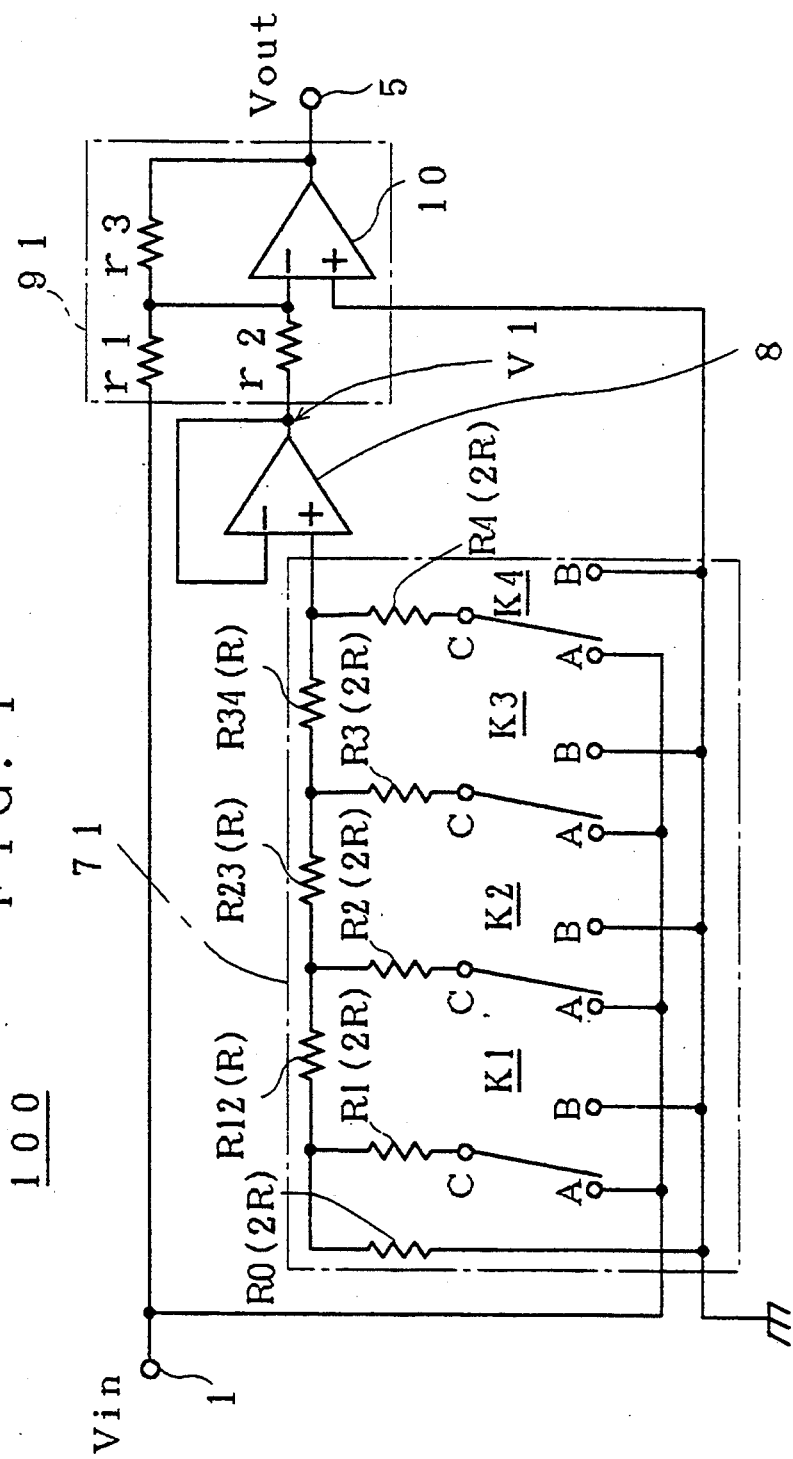
FIG. 1 is a circuit diagram of a first preferred embodiment according to the present invention.

FIG. 1 is a circuit diagram of a gain control amplifier 100 according to a first preferred embodiment of the present invention. A signal input terminal 1 receiving an input signal $V_{in}$ is connected to a variable resistor portion 71 including an R-2R ladder resistor group and switches $K_1$ to $K_4$. An operational amplifier 8 has a non-inverting input connected to the variable resistor portion 71, an inverting input and an output connected to the inverting input thereof to function as a buffer.

An operational amplifier 10 has an inverting input connected to the signal input terminal I and the output of the operational amplifier 8 through resistors $r_1$ and $r_2$, respectively, an output connected to the inverting input thereof through a resistor $r_3$, and a non-inverting input grounded. The operational amplifier 10 and the resistors $r_1$, $r_2$, $r_3$ construct an adding circuit 91. The adding circuit 91 outputs an output signal $V_{out}$ which is given to a signal output terminal 5.

Each of the switches $K_1$ to $K_4$ includes terminals A, B and a common terminal C connected to one of the terminals A and B. All of the terminals A are connected in common to the signal input terminal 1, and all of the terminals B are grounded in common.

In the variable resistor portion 71, the common terminals C of the switches $K_1$ to $K_4$ are connected respectively to first ends of resistors $R_1$, $R_2$, $R_3$, $R_4$ of a resistance 2R. Resistors $R_{12}$, $R_{23}$, $R_{34}$ of a resistance R connect second ends of pairs of the resistors $R_1$ to $R_4$ adjacent to each other, respectively. The second end of the resistor $R_4$ connected to the switch $K_4$ positioned nearest the operational amplifier 8 is connected to the non-inverting input of the operational amplifier 8. The second end of the resistor $R_1$ connected to the switch $K_1$ positioned farthest from the operational amplifier 8 is grounded through a resistor $R_0$ of resistance 2R.

When all of the common terminals C of the switches $K_1$ to $K_4$ are connected to the terminals A thereof, an output V1 of the buffer 8 is:

$$V1 = \frac{2^4 - 1}{2^4} V_{in} \tag{5}$$

On the other hand, when all of the common terminals C of the switches $K_1$ to $K_4$ are connected to the terminals B thereof, the output V1 of the buffer 8 is zero. The switches $K_1$ to $K_4$ are located in order from the least significant bit, and the switches having the common terminal C connected to the terminal A are made to correspond to the bit "1" whereas the switches having the common terminal C connected to the terminal B are made to correspond to the bit "0", to provide a binary number. The binary number is converted into a decimal number m ($0 \leq m \leq 15$), and then:

$$V1 = \frac{m}{2^4} V_{in} \tag{6}$$

In the adding circuit 91, the following equation holds:

$$V_{out} = -\left(\frac{r_3}{r_1} V_{in} + \frac{r_3}{r_2} V1\right) \tag{7}$$

The output V1 affects the magnitude of the output signal $V_{out}$ linearly in Equation (7). From Equation (6), the switching operation of the switches $K_1$ to $K_4$ permits linear control of the output V1. Thus the switching operation of the switches $K_1$ to $K_4$ permits linear control of gain G which is represented as:

$$G = \frac{V_{out}}{V_{in}} = -\left(\frac{1}{r_1} + \frac{m}{2^4 \cdot r_2}\right) r_3 \tag{8}$$

Further, the maximum resistance is 2R, since there is no need for a large sized resistor as in the prior art.

Although four pairs of the R-2R ladder resistors and switches are shown in FIG. 1, more ladder resistors and switches enable finer, linear control of the gain G. The maximum resistance is 2R, and the same effect as FIG. 1 is provided.

Figure 2:
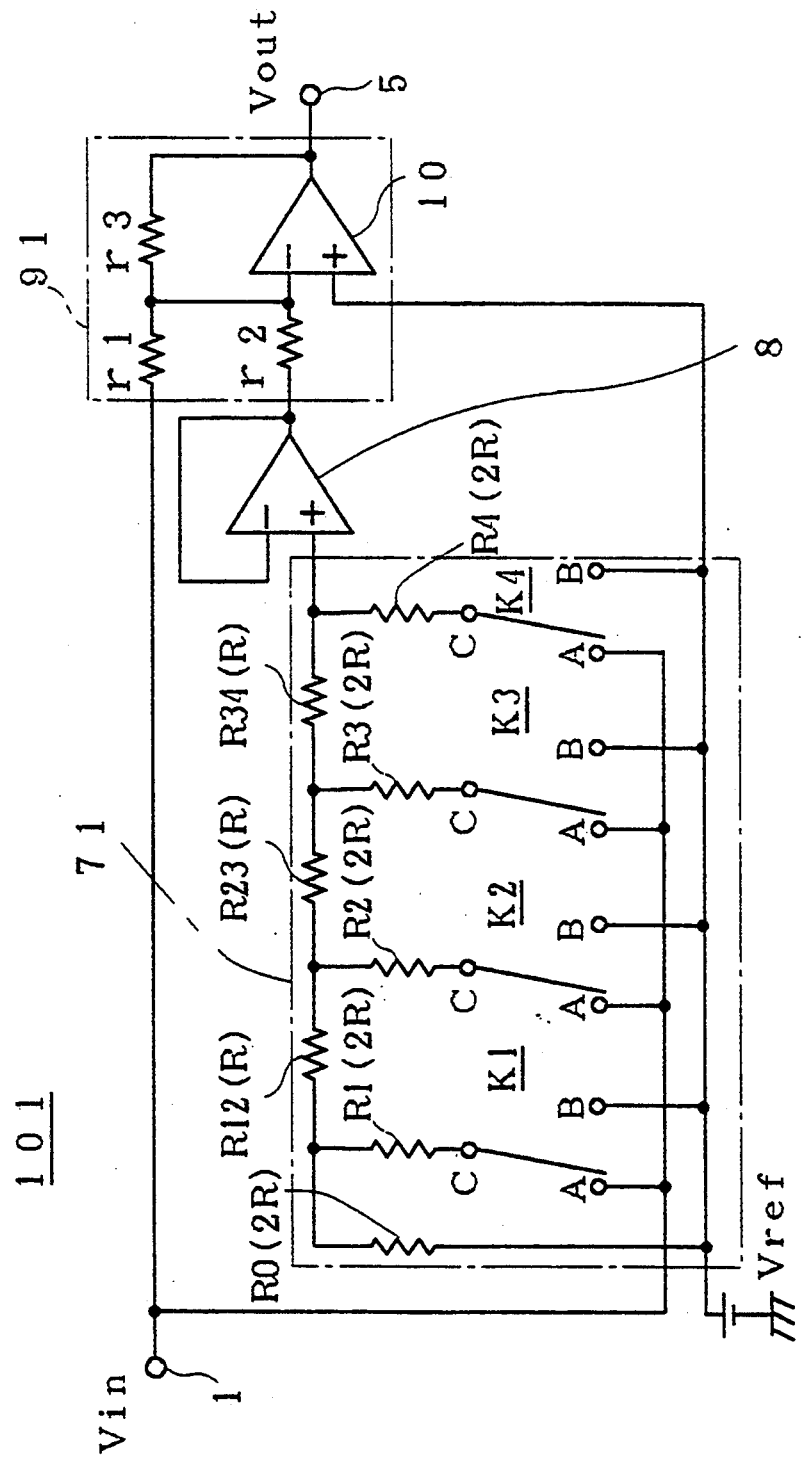
FIG. 2 is a circuit diagram of a variation of the first preferred embodiment.

The ground potential plus a potential $V_{ref}$ may be used in the circuit. FIG. 2 is a circuit diagram of a gain control amplifier 101 wherein the potential $V_{ref}$ is applied to the variable resistor portion 71 and adding circuit 91 in place of the ground potential of FIG. 1. The potential $V_{ref}$ affects the magnitude of the output signal $V_{out}$.

$$V_{out} = V_{ref}\left(1 + \frac{r_3}{r_1} + \frac{r_3}{r_2}\right) - r_3\left(\frac{1}{r_1} + \frac{m}{2^4 \cdot r_2}\right) V_{in} \tag{9}$$

The switching operation of the switches $K_1$ to $K_4$ permits the magnitude of the output signal $V_{out}$ to be controlled linearly in the same manner as the gain control amplifier 100 of FIG. 1.

B. Second Preferred Embodiment

Figure 3:
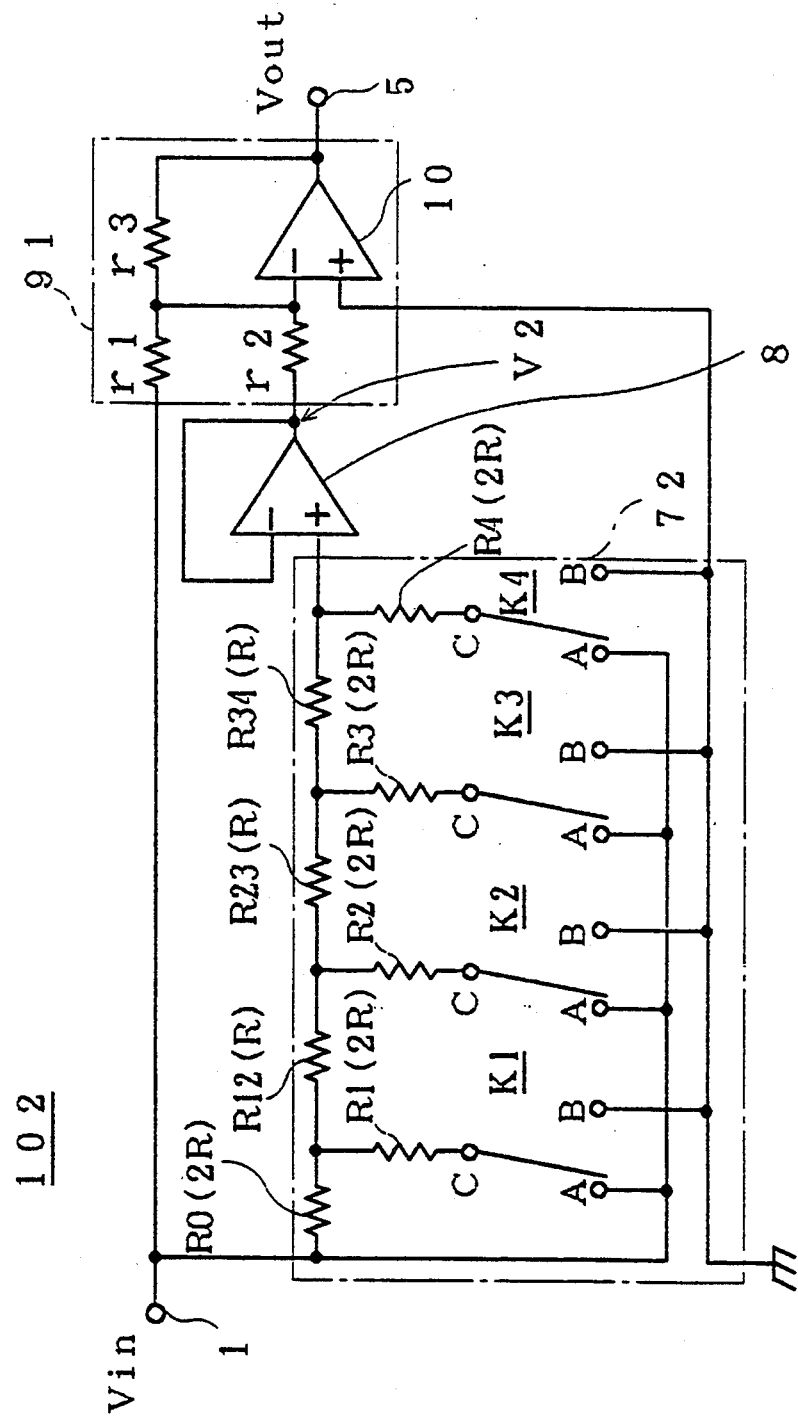
FIG. 3 is a circuit diagram of a second preferred embodiment according to the present invention.

FIG. 3 is a circuit diagram of a gain control amplifier 102 according to a second preferred embodiment of the present invention. The gain control amplifier 102 has substantially the same structure as the gain control amplifier 100 of the first preferred embodiment except that the variable resistor portion 71 is replaced with a variable resistor portion 72. The variable resistor portion 72 differs from the variable resistor portion 71 in connection of the resistor $R_0$. Although the resistor $R_0$ is grounded in the variable resistor portion 71, the resistor $R_0$ is connected to the signal input terminal 1 in the variable resistor portion 72. Because of the foregoing connection, an output V2 of the operational amplifier 8 is expressed as:

$$V2 = \frac{m+1}{2^4} V_{in} \tag{10}$$

In the adding circuit 91, the following equation holds:

$$V_{out} = -\left(\frac{r_3}{r_1} V_{in} + \frac{r_3}{r_2} V2\right) \quad (11)$$

Then the gain G of the gain control amplifier 102 is:

$$G = \frac{V_{out}}{V_{in}} = -\left(\frac{1}{r_1} + \frac{1}{r_2} \cdot \frac{m+1}{2^4}\right) r_3 \quad (12)$$

Thus the gain G is linearly controlled by the switching operation of the switches $K_1$ to $K_4$ in the same fashion as the first preferred embodiment. Further, the maximum resistance is 2R, since there is no need for a large sized resistor as in the prior art.

A variation of the gain control amplifier 102 is applicable wherein the potential $V_{ref}$ is supplied in place of the ground potential in the same manner as the relation between the gain control amplifiers 101 and 100.

Figure 4:
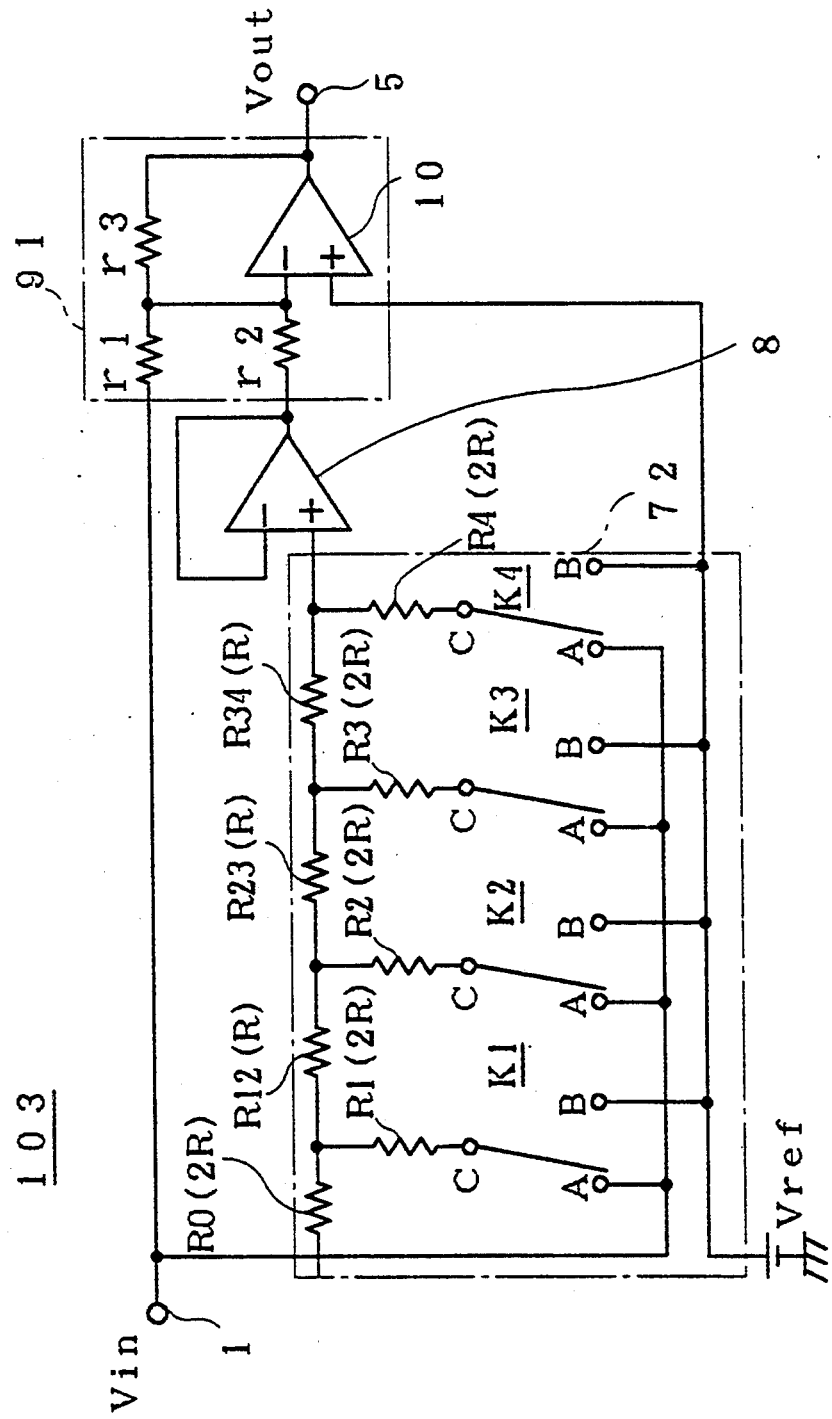
FIG. 4 is a circuit diagram of a variation of the second preferred embodiment.

FIG. 4 is a circuit diagram of a gain control amplifier 103 provided as above described. The magnitude of the output signal $V_{out}$ is:

$$V_{out} = V_{ref}\left(\frac{1}{r_1} + \frac{1}{r_2}\right) r_3 - \left(\frac{1}{r_1} + \frac{m+1}{2^4 \cdot r_2}\right) r_3 V_{in} \quad (13)$$

The magnitude of the output signal $V_{out}$ is linearly controlled by the switching operation of the switches $K_1$ to $K_4$ in the same fashion as the gain control amplifier 101 of FIG. 2.

C. Third Preferred Embodiment

Figure 5:
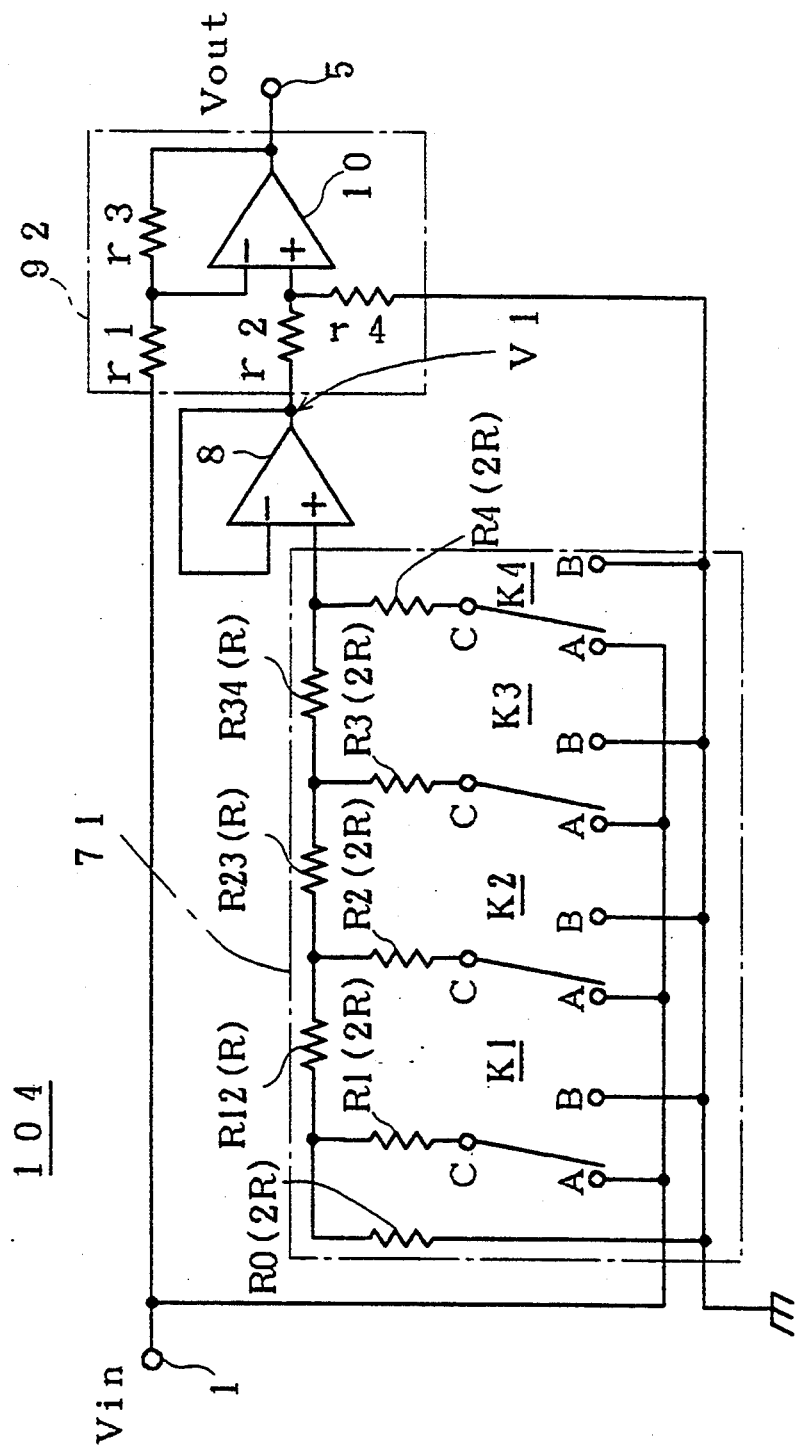
FIG. 5 is a circuit diagram of a third preferred embodiment according to the present invention.

FIG. 5 is a circuit diagram of a gain control amplifier 104 according to a third preferred embodiment of the present invention. The signal input terminal 1 receiving the input signal $V_{in}$ is connected to the variable resistor portion 71 in the same manner as the first preferred embodiment. The variable resistor portion 71 is connected to the non-inverting input of the operational amplifier 8 serving as a buffer. The inverting input of the operational amplifier 8 is connected to the output thereof.

The inverting input of the operational amplifier 10 is connected to the signal input terminal 1 and the output thereof through the resistors $r_1$ and $r_3$, respectively. The non-inverting input of the operational amplifier 10 is connected to the output of the operational amplifier 8 through the resistor $r_2$ and is grounded through the resistor $r_4$. The operational amplifier 10 and the resistors $r_1$, $r_2$, $r_3$, $r_4$ construct a subtraction circuit 92. The subtraction circuit 92 outputs the output signal $V_{out}$ which is applied to the signal output terminal 5.

Since the connection between the variable resistor portion 71 and the operational amplifier 8 is identical with that of the first preferred embodiment, the output V1 of the operational amplifier 8 is given by Equation (6). Assuming that $r_1=r_2=r_s$ and $r_3=r_4=r_f$ in the subtraction circuit 92, then the following equation holds:

$$V_{out} = \frac{r_f}{r_s}(V1 - V_{in}) \quad (14)$$

Thus the gain G of the gain control amplifier 104 is:

$$G = \frac{V_{out}}{V_{in}} = \frac{r_f}{r_s}\left(\frac{m}{2^4} - 1\right) \quad (15)$$

The gain G is linearly controlled by the switching operation of the switches $K_1$ to $K_4$ in the same fashion as the first preferred embodiment. Further, the maximum resistance is 2R, since there is no need for a large sized resistor as in the prior art.

A variation of the gain control amplifier 104 is applicable wherein the potential $V_{ref}$ is supplied in place of the ground potential in the same manner as the relation between the gain control amplifiers 101 and 100.

Figure 6:
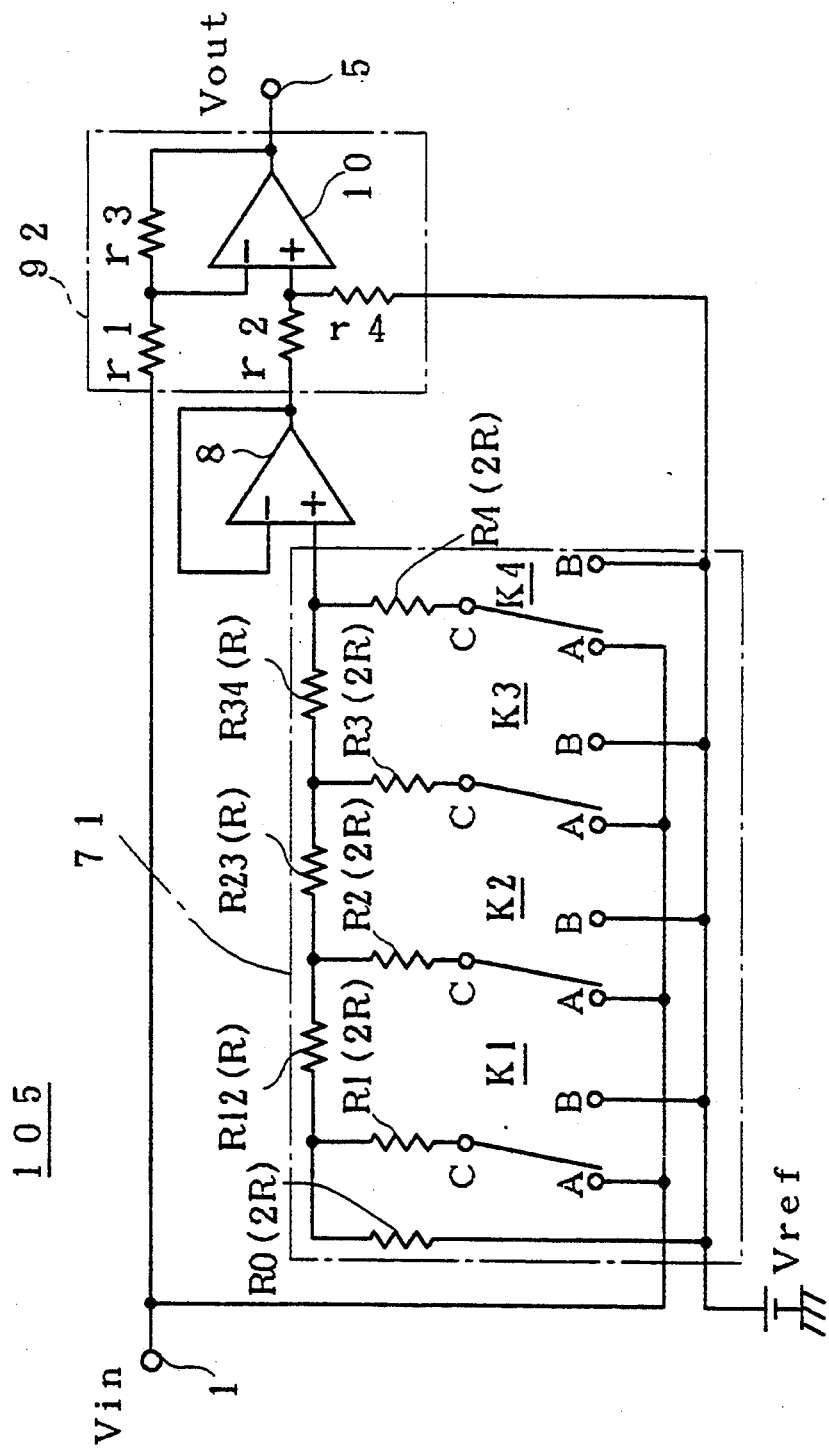
FIG. 6 is a circuit diagram of a variation of the third preferred embodiment.

FIG. 6 is a circuit diagram of a gain control amplifier 105 provided as above described. The magnitude of the output signal $V_{out}$ is:

$$V_{out} = \frac{r_f}{r_s}\left[\left(\frac{m}{2^4} - 1\right)V_{in} - V_{ref}\right] \quad (16)$$

The magnitude of the output signal $V_{out}$ is linearly controlled by the switching operation of the switches $K_1$ to $K_4$ in the same fashion as the first and second preferred embodiments.

D. Fourth Preferred Embodiment

Figure 7:
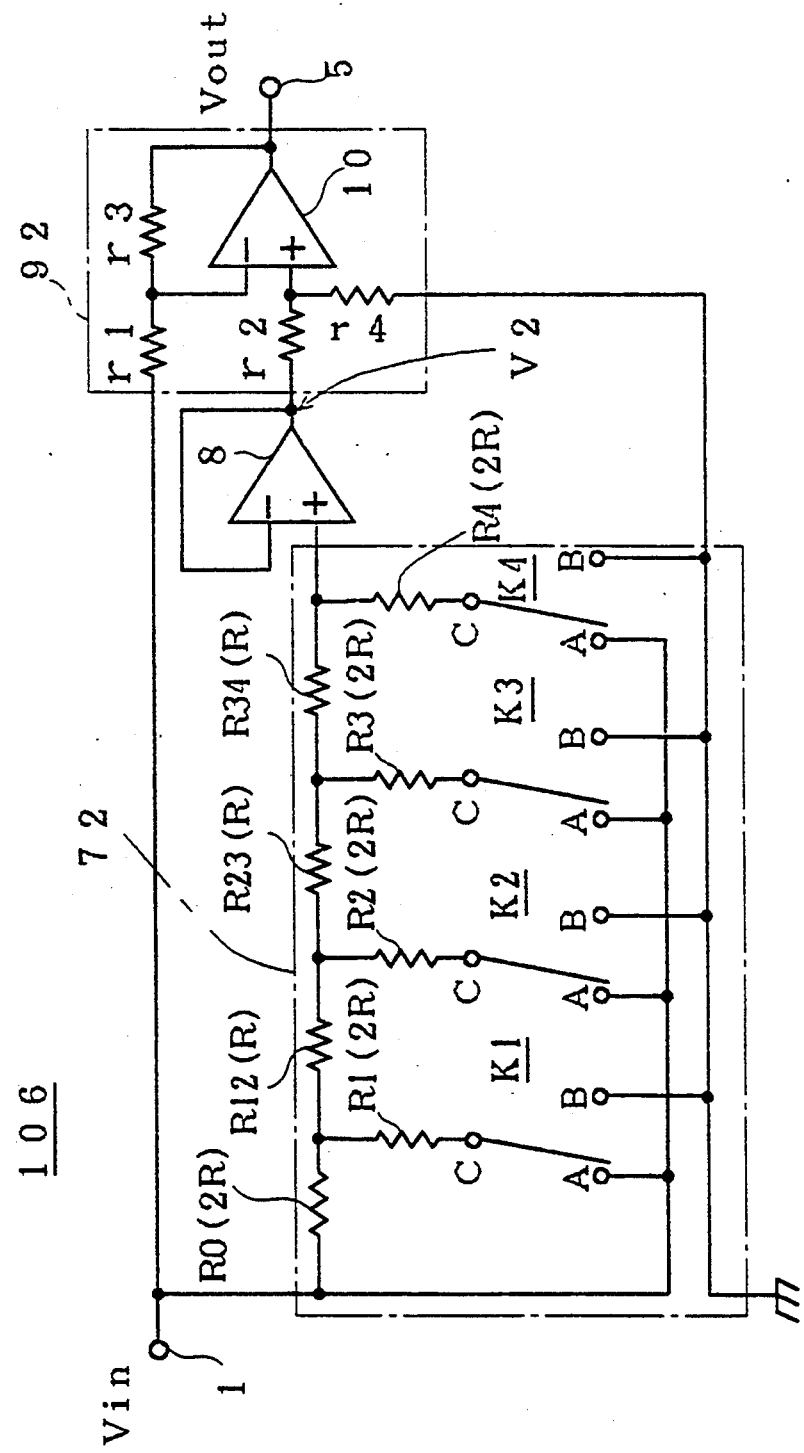
FIG. 7 is a circuit diagram of a fourth preferred embodiment according to the present invention.

FIG. 7 is a circuit diagram of a gain control amplifier 106 according to a fourth preferred embodiment of the present invention. The gain control amplifier 106 has substantially the same structure as the gain control amplifier of the third preferred embodiment except that the variable resistor portion 71 is replaced with the variable resistor portion 72. The output V2 of the operational amplifier 8 is thus represented by Equation (10). Since the subtraction circuit 92 has the relation of Equation (14), the gain G of the gain control amplifier 106 is expressed as:

$$G = \frac{V_{out}}{V_{in}} = \frac{r_f}{r_s}\left(\frac{m+1}{2^4} - 1\right) \quad (17)$$

Thus the gain G is linearly controlled by the switching operation of the switches $K_1$ to $K_4$ while the maximum resistance is 2R in the same manner as the first to third preferred embodiments.

A variation of the gain control amplifier 106 is applicable wherein the potential $V_{ref}$ is supplied in place of the ground potential in the same manner as the relation between the gain control amplifiers 101 and 100.

Figure 8:
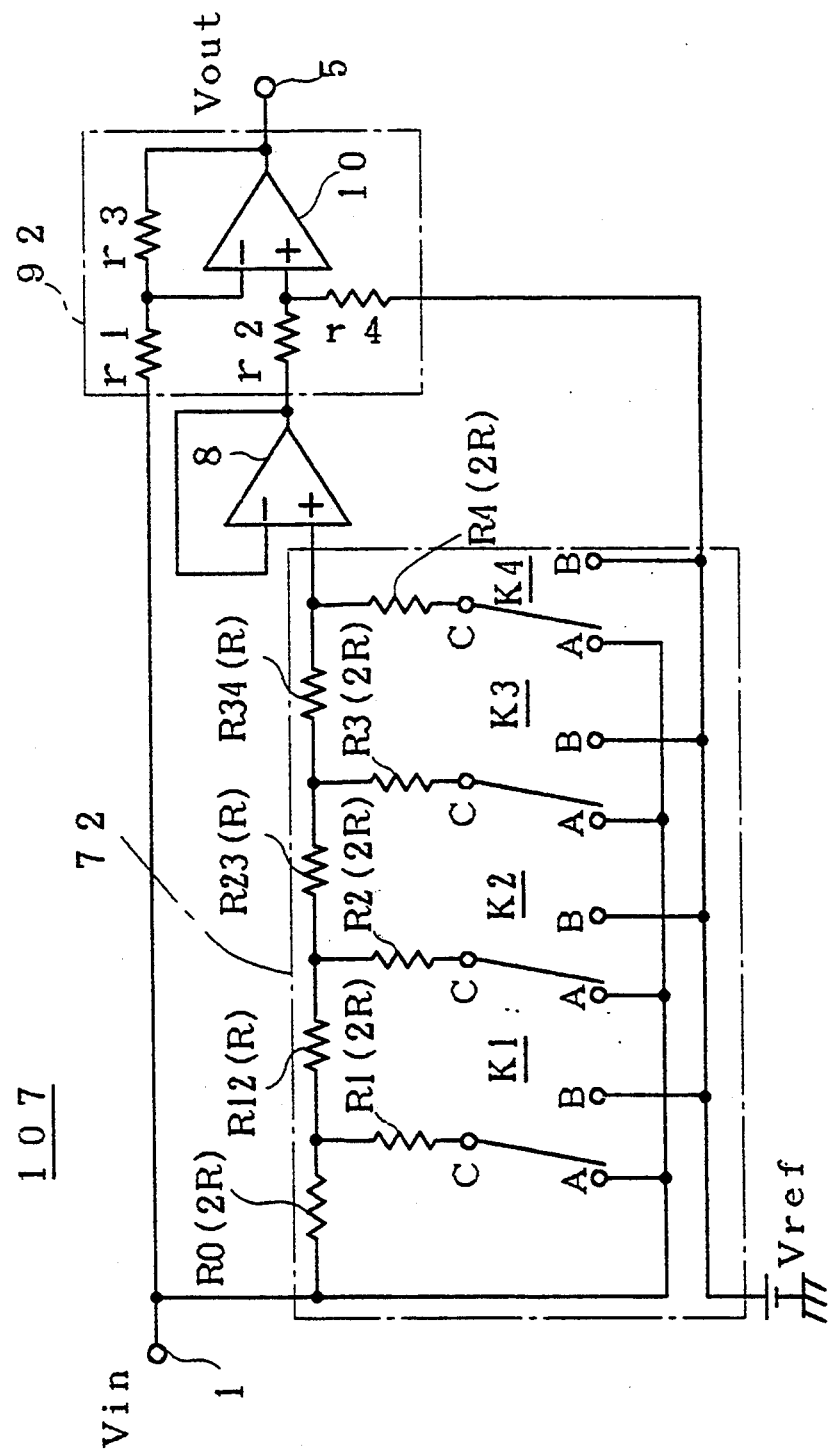
FIG. 8 is a circuit diagram of a variation of the fourth preferred embodiment.

FIG. 8 is a circuit diagram of a gain control amplifier 107 provided as above described. The magnitude of the output signal $V_{out}$ is:

$$V_{out} = \frac{r_f}{r_s}\left[\left(\frac{m+1}{2^4} - 1\right)V_{in} - V_{ref}\right] \quad (18)$$

The magnitude of the output signal $V_{out}$ is linearly controlled by the switching operation of the switches $K_1$ to $K_4$ in the same fashion as the first to third preferred embodiments.

E. Fifth Preferred Embodiment

Figure 9:
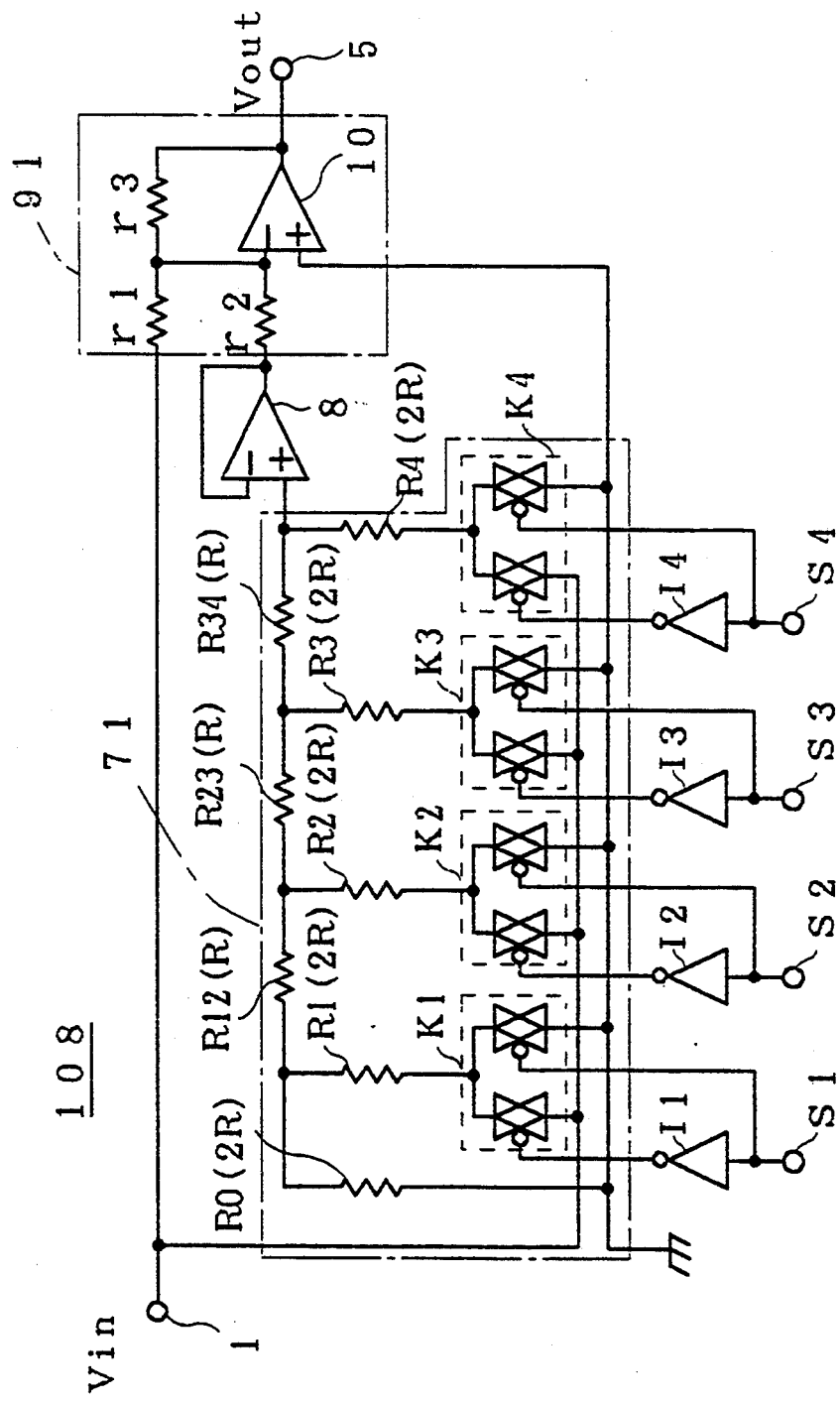
FIG. 9 is a circuit diagram of a fifth preferred embodiment according to the present invention.

FIG. 9 is a circuit diagram of a gain control amplifier 108 according to a fifth preferred embodiment of the present invention. The gain control amplifier 108 is a variation of the gain control amplifier 100 of the first preferred embodiment, and comprises the switches $K_1$ to $K_4$ including transmission gates.

The switch $K_1$ includes a pair of transmission gates. A logical signal from a terminal S1 is applied to one of the transmission gates as it is, and is also applied to an inverter I1 for inverting the signal, the inverted signal being applied to the other transmission gate. When the logical signal "H" is applied to the terminal S1, the resistor $R_1$ is connected to the signal input terminal. When the logical signal "L" is applied to the terminal S1, the resistor $R_1$ is grounded. The application of the logical signal "H" or "L" to the terminal S1 corresponds to the connection of the common terminal C of the switch $K_1$ to the terminal A or B in the gain control amplifier 100. The same is true for the switches $K_2$ to $K_4$. Therefore, the binary-to-decimal converted value of the four bits given by arranging the logical signals applied to the terminals S1 to S4 in inverse order is equivalent to the value m.

Figure 10:
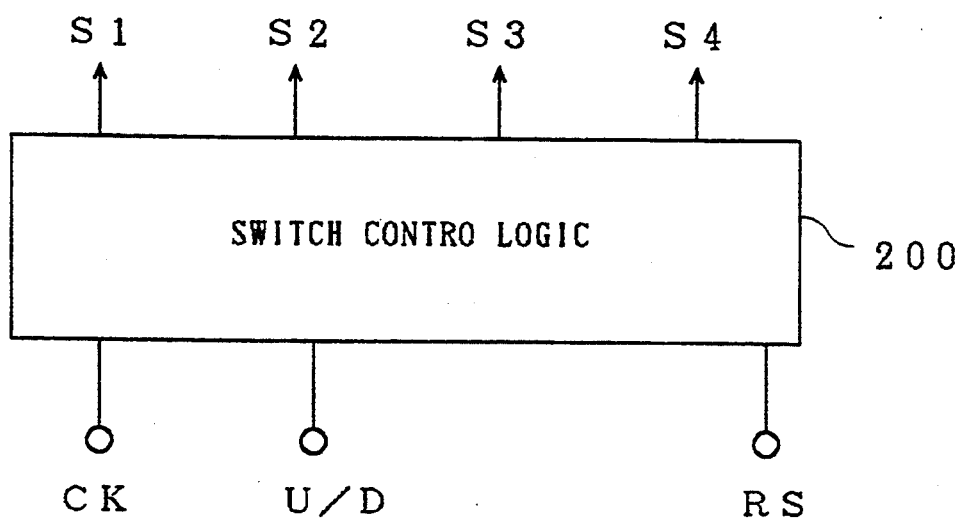
FIG. 10 is a block diagram delineating the fifth preferred embodiment.

The logical signals are supplied to the terminals S1 to S4 from external control means. FIG. 10 is a block diagram of a switch control logic serving as the control means. A switch control logic 200 accepts a clock input CK, an up/down input U/D, and a reset input RS, which control the counting timing, counting up/down switching, and count reset in the switch control logic 200, respectively. The switch control logic 200 is connected to the terminals S1 to S4 shown in FIG. 9 and outputs the respective signals thereto.

Figure 11:
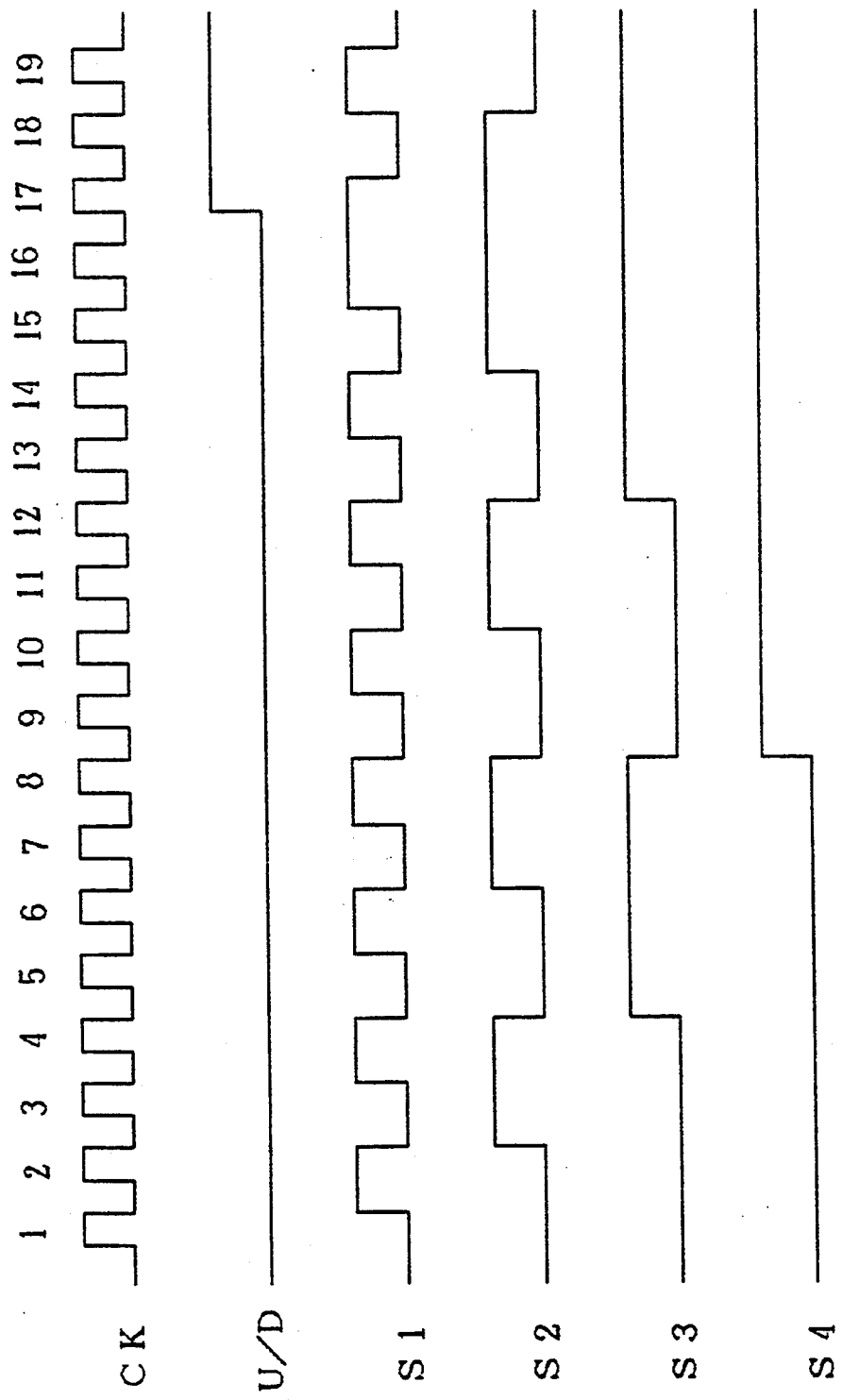
FIG. 11 is a timing chart delineating the operation of the fifth preferred embodiment.

FIG. 11 is a timing chart showing the operation of the switch control logic 200. The switch control logic 200 counts up when the up/down input U/D is "L" and counts down when the up/down input U/D is "H". As the clock input CK falls when the up/down input is "L", the switch control logic 200 counts up, and the terminals S1 to S4 present the waveforms shown in FIG. 11. At the third falling of the clock input CK, for example, the signals at the terminals S1 to S4 are "H", "H", "L", "L", respectively, which are arranged in inverse order and are converted into a decimal value of "3". This value designates the number of fallings of the clock input CK.

In response to the falling of the clock input CK, the value of the inversely arranged signals of the terminals S1 to S4 is counted up. With the up/down input U/D being "L", the logical signals at the terminals S1 to S4 are not changed when fifteen or more fallings of the clock input CK are detected. The counting down is not carried out in response to the falling of the clock input CK until the up/down input U/D is changed to "H".

Since the gain is controlled linearly by using the values at the terminals S1 to S4, as above mentioned, and the clock input CK sequentially changes the values at the terminals S1 to S4, the clock input CK is enabled to linearly increase/decrease the gain of the gain control circuit 108 in sequential order.

F. Sixth Preferred Embodiment

Figure 12:
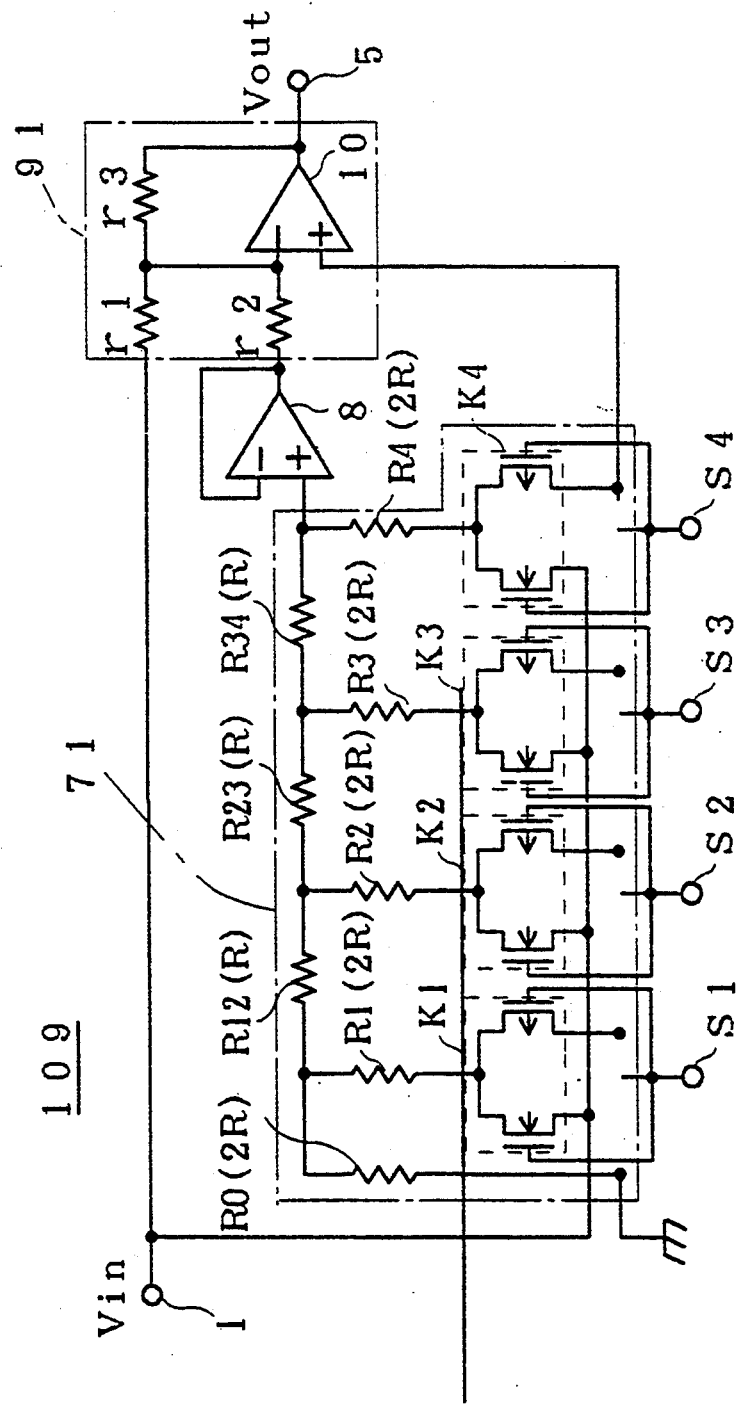
FIG. 12 is a circuit diagram of a sixth preferred embodiment according to the present invention.
Figure 13:
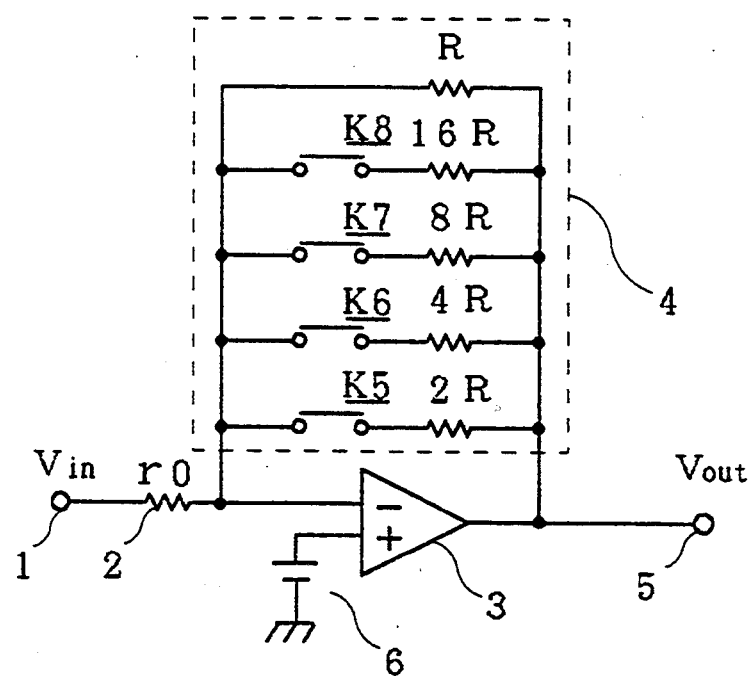
FIG. 13 is a circuit diagram of the prior art.

FIG. 12 is a circuit diagram of a gain control amplifier 109 according to a sixth preferred embodiment of the present invention. The gain control amplifier 109 is a variation of the gain control amplifier 100 of the first preferred embodiment and comprises the switches $K_1$ to $K_4$ each including a pair of MOS transistors of complementary conductivity types.

The logical signal applied to the terminal S1 is applied to gate electrodes of NMOS and PMOS transistors forming the switch $K_1$ in common. In response to the logical signal "H" to the terminal S1, the NMOS transistor turns on and the PMOS transistor turns off, the resistor $R_1$ being connected to the signal input terminal 1. Conversely, in response to the logical signal "L" to the terminal S1, the NMOS transistor turns off and the PMOS transistor turns on, the resistor $R_1$ being grounded.

The application of the logical signal "H" or "L" to the terminal S1 corresponds to the connection of the common terminal C of the switch $K_1$ to the terminal A or B in the gain control amplifier 109. The same is true for the switches $K_2$ to $K_4$. Therefore the binary-to-decimal converted value of the four bits obtained by arranging the logical signals at the terminals S1, S2, S3, S4 in inverse order is equivalent to the value m in the same fashion as the fifth preferred embodiment.

In the sixth preferred embodiment, the values to be applied to the terminals S1 to S4 may be controlled by using the switch control logic 200 of the fifth preferred embodiment.

While the invention has been shown and described in detail, the foregoing description is in all aspects illustrative and not restrictive. It is therefore understood that numerous modifications and variations can be devised without departing from the scope of the invention.

What is claimed is:

1. A gain control amplifier, comprising:
   (a) a signal input terminal and a signal output terminal;
   (b) a potential point for supplying a reference potential;
   (c) a variable resistor portion having a first input connected to said signal input terminal, a second input connected to said potential point, and an output; and
   (d) an arithmetic portion having a first input connected to said signal input terminal, a second input connected to said output of said variable resistor portion, a third input connected to potential point, and an output connected to said signal output terminal, for performing a linear calculation on values applied to said first to third inputs thereof to output a calculated value to said output thereof, said variable resistor portion including:
   (c-1) first to N-th ($2 \leq N$) switches each including first and second ends connected respectively to said first and second inputs of said variable resistor portion and a common end connected to one of said first and second ends thereof;
   (c-2) at least one resistor $R_K$ ($1 \leq K \leq N$) each having a first end connected to said common end of the K-th switch and a second end;
   (c-3) at least one resistor $R_{M,(M+1)}$ ($1 \leq M \leq (K-1)$) for connecting said second end of the M-th resistor $R_M$ to said second end of the (M+1)-th resistor $R_{(M+1)}$; and
   (c-4) a resistor $R_0$ having a first end connected to said second end of the resistor $R_1$ and a second end,
   (c-5) said resistor $R_{M,(M+1)}$ being of a resistance R and said resistors $R_0$ to $R_N$ being of a resistance 2R, (c-6) said second end of said resistor $R_0$ being connected to one of said first and second inputs of said variable resistor portion, (c-7) said second end of said resistor $R_N$ being connected to output of said variable resistor portion.

2. The gain control amplifier of claim 1, further comprising:

a buffer provided between said output of said variable resistor portion and said second input of said arithmetic portion.

3. The gain control amplifier of claim 1, wherein said K-th switch includes first and second transmission gates controlled by complementary logical signals, said first transmission gate controls connection/disconnection between said common end and first end of said K-th switch, and said second transmission gate controls connection/disconnection between said common end and second end of said K-th switch.

4. The gain control amplifier of claim 3, further comprising:

an up/down counter for controlling said K-th switch.

5. The gain control amplifier of claim 1, wherein said K-th switch includes an NMOS transistor and a PMOS transistor, said NMOS transistor controls connection/disconnection between said common end and first end of said K-th switch, and said PMOS transistor controls connection/disconnection between said common end and second end of said K-th switch.

6. The gain control amplifier of claim 5, further comprising:

an up/down counter for controlling said K-th switch.

7. The gain control amplifier of claim 1, wherein said arithmetic portion is an adding circuit for performing addition.

8. The gain control amplifier of claim 7, wherein said arithmetic portion includes:

(d-1) a first resistor having a first end connected to said first input of said arithmetic portion and a second end;

(d-2) a second resistor having a first end connected to said second input of said arithmetic portion and a second end;

(d-3) an operational amplifier having an inverting input connected to said second ends of said first and second resistors in common, a non-inverting input connected to said third input of said arithmetic portion, and an output connected to said output of said arithmetic portion; and (d-4) a third resistor connected to said inverting input and output of said operational amplifier.

9. The gain control amplifier of claim 1, wherein said arithmetic portion is a subtraction circuit for performing subtraction.

10. The gain control amplifier of claim 9, wherein said arithmetic portion includes:

(d-5) a first resistor having a first end connected to said first input of said arithmetic portion and a second end;

(d-6) a second resistor having a first end connected to said second input of said arithmetic portion and a second end;

(d-7) a third resistor having a first end connected to said third input of said arithmetic portion and a second end;

(d-8) an operational amplifier having an inverting input connected to said second end of said first resistor, a non-inverting input connected to said second ends of said second and third resistors in common, and an output connected to said output of said arithmetic portion; and (d-9) a fourth resistor connected to said inverting input and output of said operational amplifier.

11. The gain control amplifier of claim 1, wherein said second end of said resistor $R_0$ is connected to said first input of said variable resistor portion.

12. The gain control amplifier of claim 1, wherein said second end of said resistor $R_0$ is connected to said second input of said variable resistor portion.

13. The gain control amplifier of claim 1, wherein said reference potential is a ground potential.

* * * * *